United States Patent [19]
Yasugi et al.

[11] Patent Number: 5,655,532
[45] Date of Patent: Aug. 12, 1997

[54] MAGNETIC RESONANCE IMAGING APPARATUS AND ITS METHOD

[75] Inventors: Yukihiro Yasugi, Tokyo; Koji Kajiyama, Kamagaya; Hiroyuki Takeuchi, Kashiwa, all of Japan

[73] Assignee: Hitachi Medical Corporation, Tokyo, Japan

[21] Appl. No.: 448,111

[22] Filed: May 22, 1995

Related U.S. Application Data

[63] Continuation of Ser. No. 24,229, Mar. 1, 1993, abandoned.

[30] Foreign Application Priority Data

Feb. 28, 1992 [JP] Japan ................................ 4-075728

[51] Int. Cl.$^6$ ............................................. A61B 5/055
[52] U.S. Cl. ......................................... 128/653.2; 324/309
[58] Field of Search ............................. 128/653.2, 653.1; 324/309; 364/413.15, 413.16, 413.17, 413.18, 413.19, 413.13

[56] References Cited

U.S. PATENT DOCUMENTS

| | | | |
|---|---|---|---|
| 4,549,139 | 10/1985 | MacFall et al. | 324/309 |
| 4,587,489 | 5/1986 | Wehrli | 324/309 |
| 4,604,579 | 8/1986 | Cannon et al. | 324/309 |
| 4,709,212 | 11/1987 | MacFall et al. | 324/309 |
| 4,717,879 | 1/1988 | Riederer et al. | |
| 4,851,778 | 7/1989 | Kaufman et al. | 324/309 |
| 4,979,512 | 12/1990 | Heubes. | |
| 4,982,160 | 1/1991 | Hagiwara | 324/309 |
| 4,986,272 | 1/1991 | Riederer et al. | 128/653.2 |
| 5,239,266 | 8/1993 | Kaufman et al. | 324/309 |
| 5,243,283 | 9/1993 | Tokunaga et al. | 324/309 |

FOREIGN PATENT DOCUMENTS

| | | |
|---|---|---|
| 0465068 | 1/1992 | European Pat. Off. . |
| 2623907 | 6/1989 | France . |

OTHER PUBLICATIONS

"NMR Medical Science (Basis and Clinical Application)", edited by NMR Medical Science Society, Research Meeting, published by K.K. Maruzen, Jan. 20, 1984.

Primary Examiner—Brian L. Casler
Attorney, Agent, or Firm—Antonelli, Terry, Stout & Kraus, LLP

[57] ABSTRACT

A magnetic resonance imaging method includes the steps of setting a repetition time in accordance with an intensity of an encoding gradient magnetic field, applying a gradient magnetic field for a slice, the set encoding gradient magnetic field, a readout gradient magnetic field, and RF pulses to a subject in a predetermined sequence of the set repetition time, measuring nuclear magnetic resonance (NMR) signals inside the subject in a full encode range with a first repetition time, continuously measuring, at least one time, NMR signals in a first range containing a zero encoding quantity and sandwiched between two predetermined intensities of the encoding gradient magnetic field with a repetition time which is different from the first repetition time, and reconstructing an image by combining the measured NMR signals with one another.

6 Claims, 15 Drawing Sheets

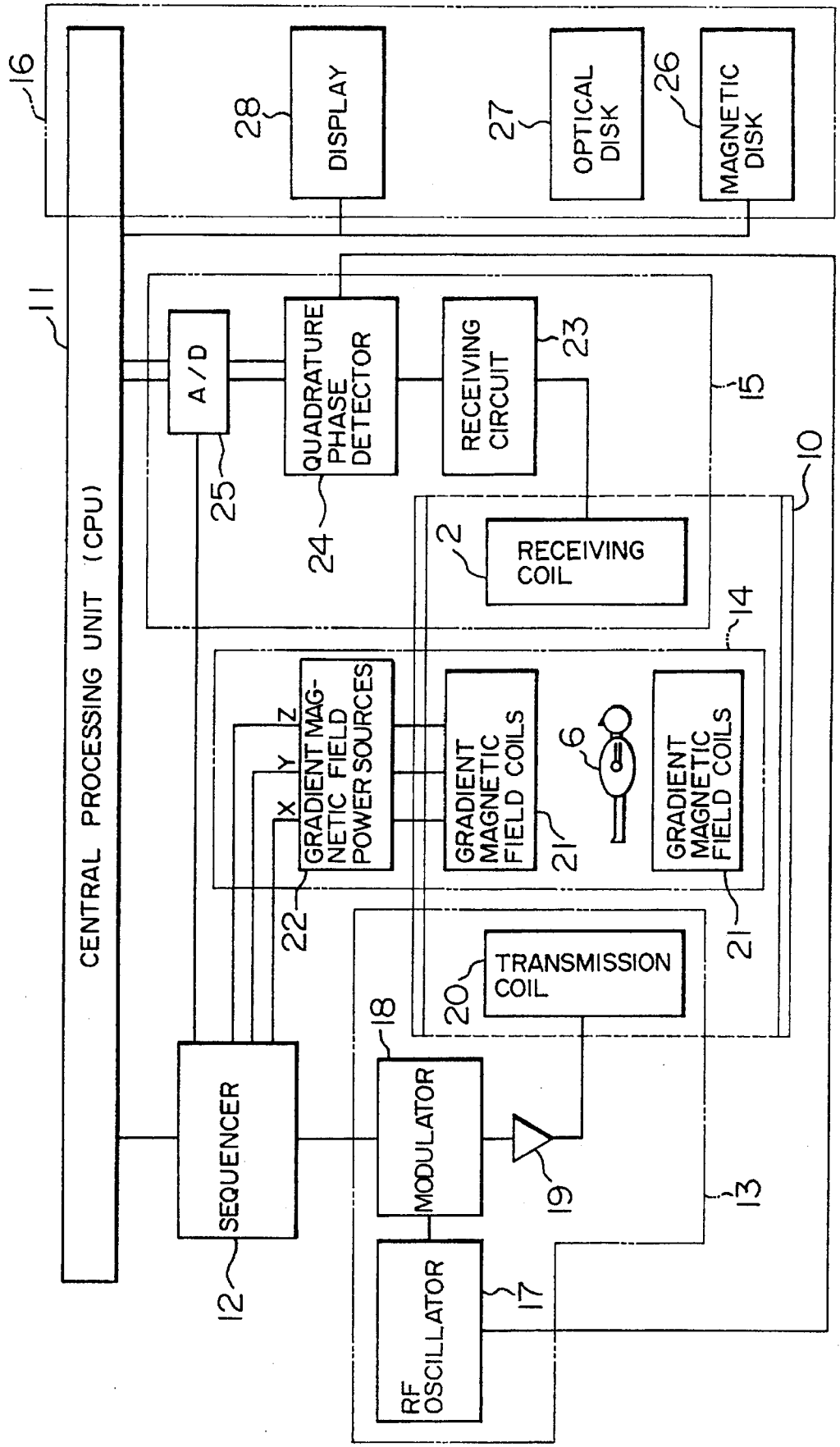

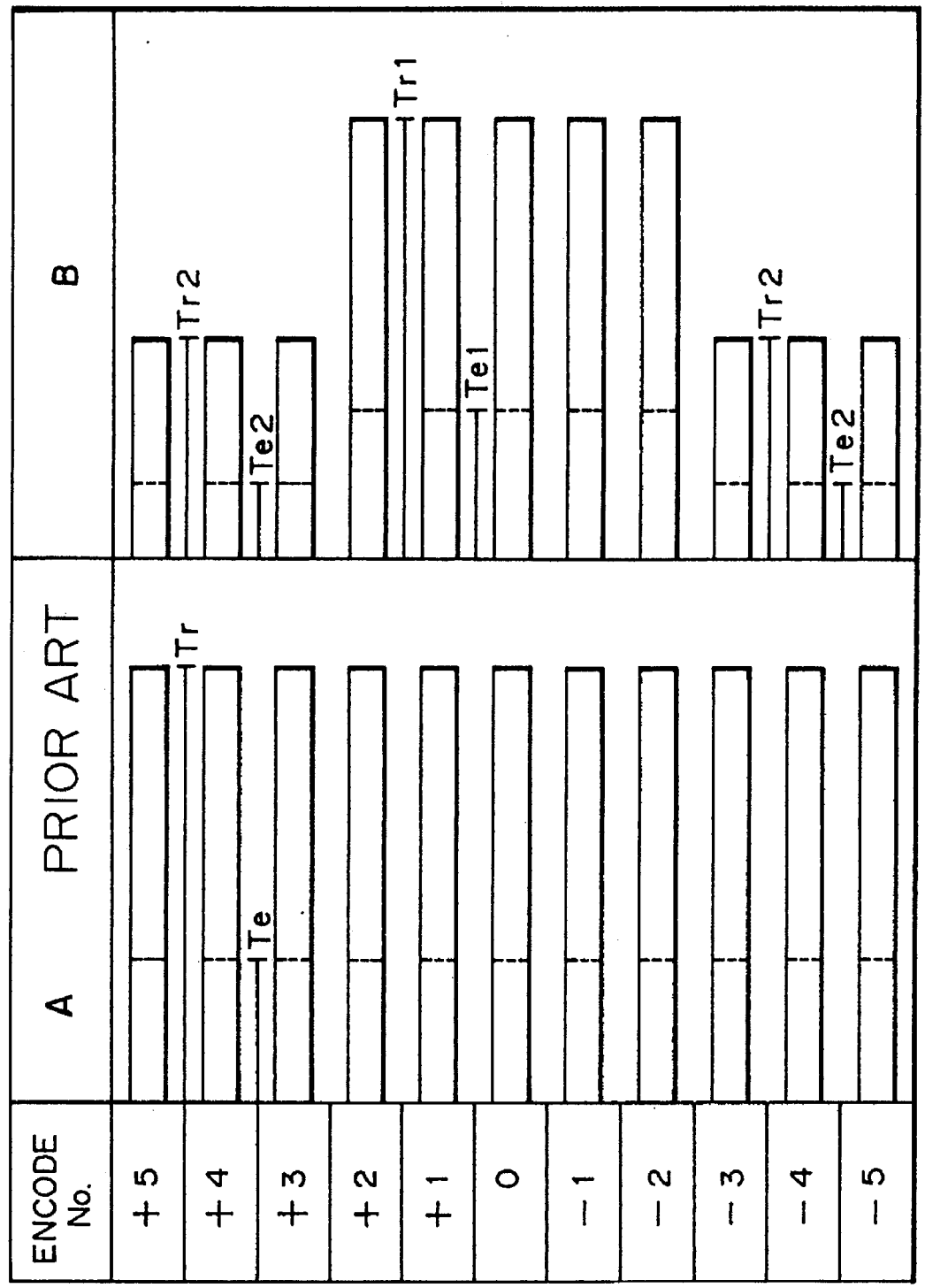

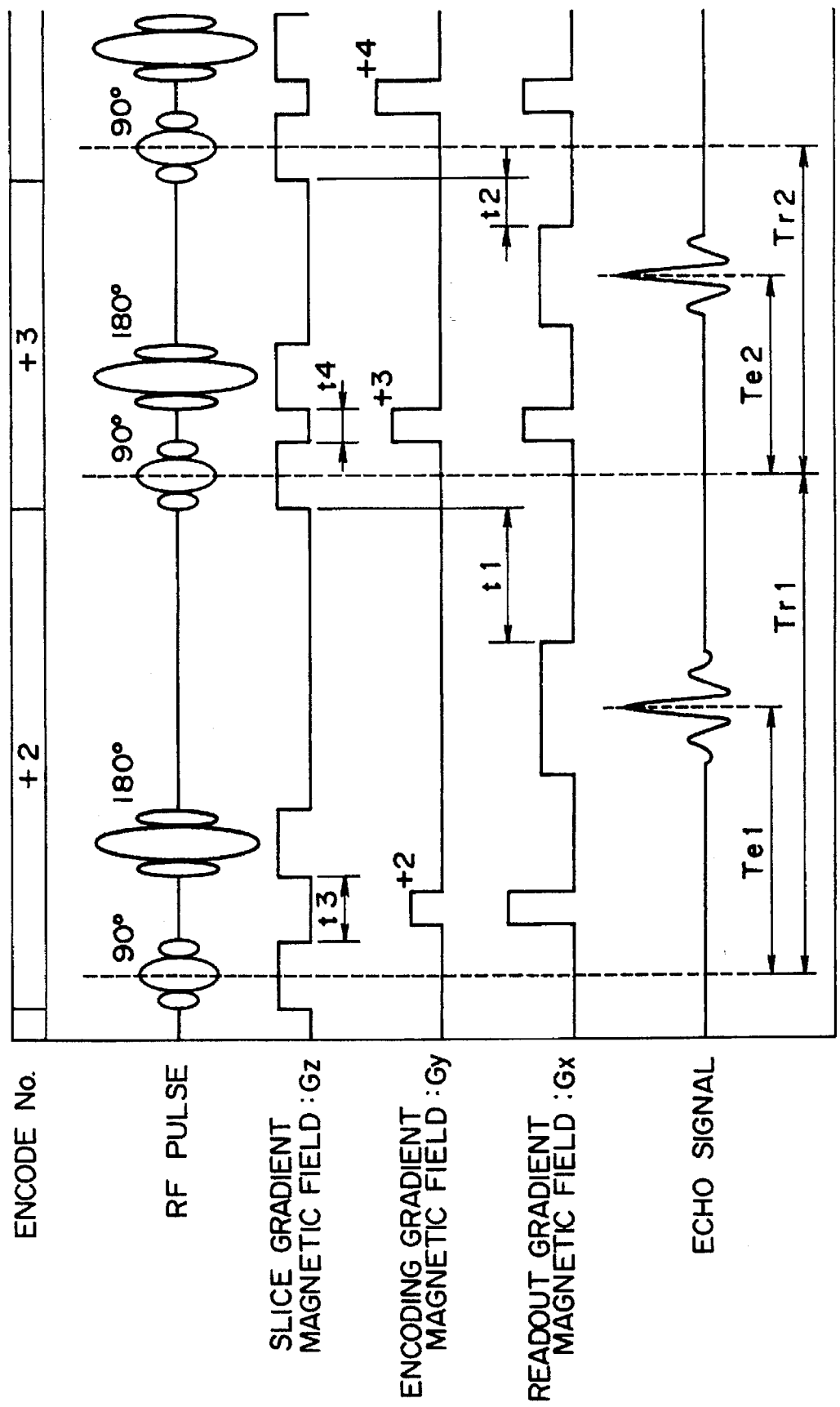

FIG. 9

| A | | | | B | C | D |
|---|---|---|---|---|---|---|
| MEASURE-MENT DATA | Tr | Te | PARTIAL RECONSTRUC-TION IMAGE | T1 WEIGHTED IMAGE | T2 WEIGHTED IMAGE | PROTON DENSITY IMAGE |
| +5, +4, +3, −3, −4, −5 | S | S | 51 | | | |
| +2, +1, 0, −1, −2 | S | S | 52 | DATA RANGE USED FOR RECON-STRUCTION | | |
| +2, +1, 0, −1, −2 | L | L | 53 | | | |
| +2, +1, 0, −1, −2 | L | S | 54 | | | |

ENCODE No.

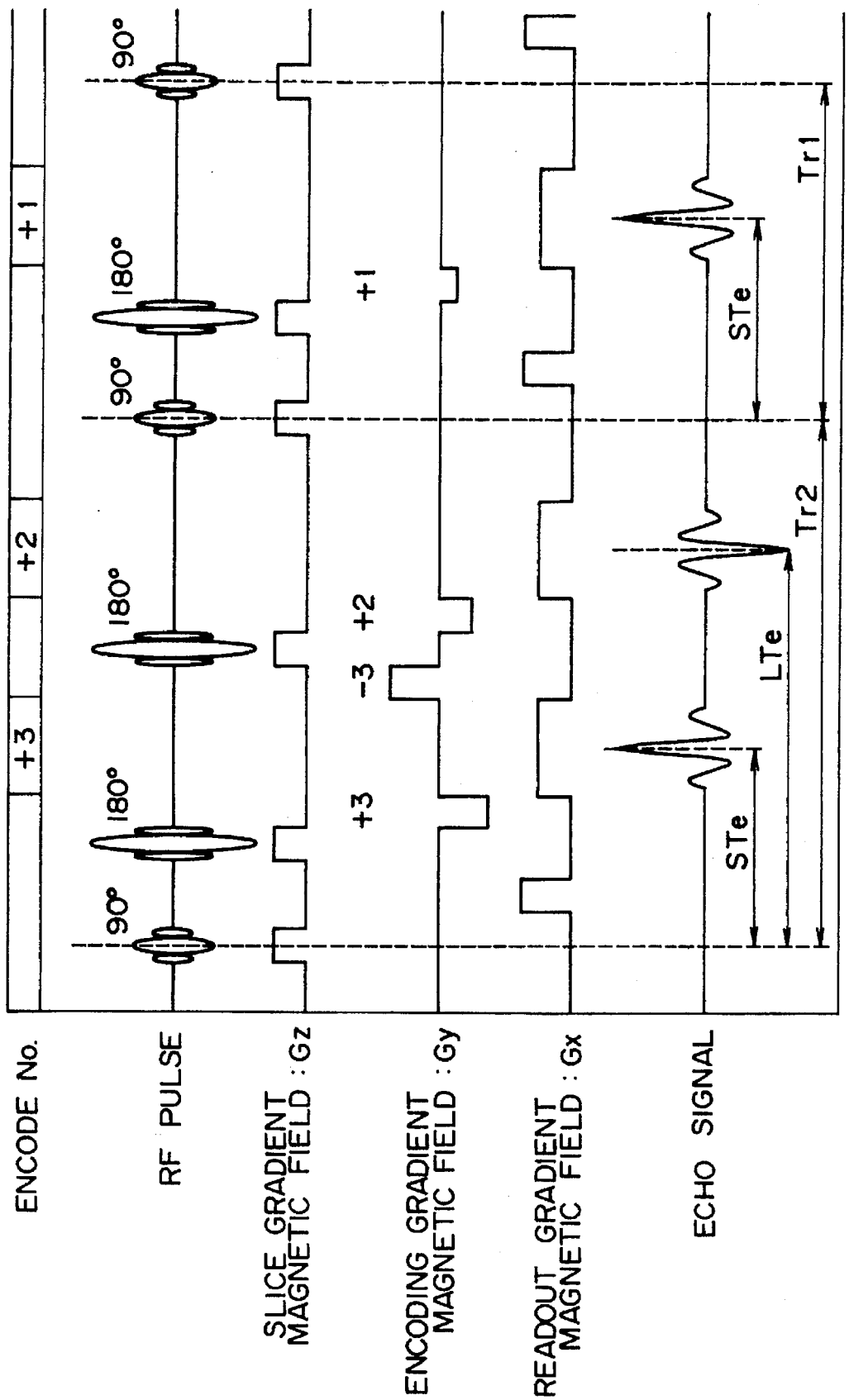

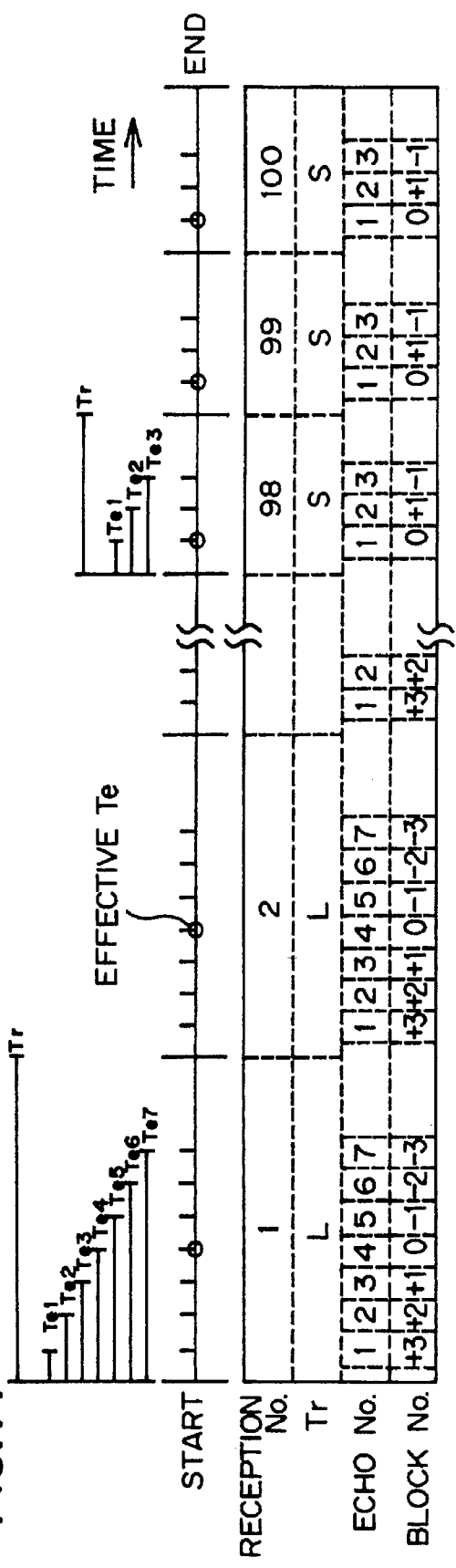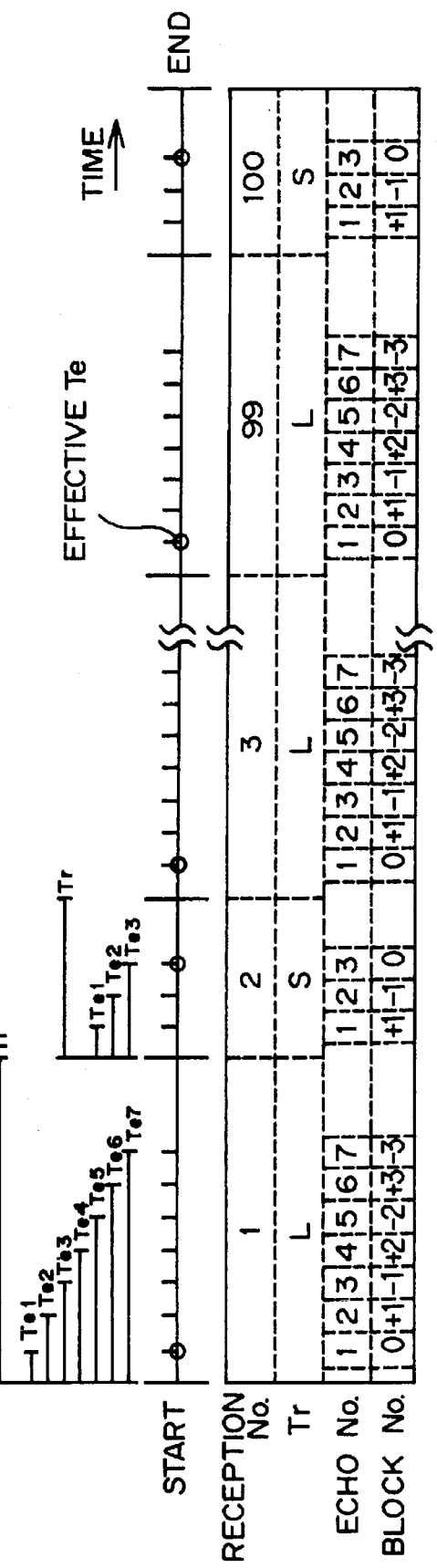

FIG. 16

| ENCODE No. | A<br>REDUCTION OF IMAGING TIME | B<br>IMPROVEMENT OF CONTRAST WEIGHTING |
|---|---|---|
| +5 | | |
| +4 | | |
| +3 | | |
| +2 | | Te    Tr |
| +1 | Te    Tr | |
| 0 | | |
| −1 | | |
| −2 | | |
| −3 | | |
| −4 | | |
| −5 | | |

MAGNETIC RESONANCE IMAGING APPARATUS AND ITS METHOD

This is a continuation of application Ser. No. 024,229 filed on Mar. 1, 1993 now abandoned.

BACKGROUND OF THE INVENTION

This invention relates to the reduction of an imaging time and an improvement in image quality in a magnetic resonance imaging apparatus for imaging a desired portion of a subject by utilizing magnetic resonance.

A magnetic resonance imaging apparatus (hereinafter referred to as the "MRI" apparatus) measures a density distribution of nuclear spins, a relaxation time distribution, etc., at a desired portion to be inspected inside a subject by utilizing nuclear magnetic resonance, and displays the image of a section of the subject from the measurement data.

A nuclear spin of the subject placed inside a homogeneous and strong static magnetic field generator causes precession in a direction of a static magnetic field as an axis with a frequency (Larmor frequency) which is determined by the intensity of the static magnetic field. When a radio frequency pulse having a frequency equal to this Larmor frequency is irradiated from outside the subject, the nuclear spin is excited and shifts to a high energy state (nuclear magnetic resonance). When the irradiation of the radio frequency pulse is cut off, each nuclear spin returns to its original low energy state with a time constant corresponding to the respective state, and emits an electromagnetic wave (NMR signal) to the outside. This signal is detected by a radio frequency reception coil tuned to its frequency. To add position data to the detected signal, the MRI apparatus applies gradient magnetic fields of three axes corresponding to a slice direction, an encoding direction and a readout direction to the space of the static magnetic field. As a result, the signal from each position inside the subject can be separated and distinguished as frequency data.

Next, an image reconstruction method in the MRI apparatus will be explained. To begin with, a pulse sequence in a spin echo method employed generally will be explained. FIG. 2 of the accompanying drawings shows the pulse sequence. There are two kinds of radio frequency pulses (RF pulses), that is, a 90° pulse and a 180° pulse. These pulses are applied to the subject with the slice gradient magnetic field to excite the nuclear spins in the section or slice to be imaged. When the slice gradient magnetic field $G_z$ is applied in a Z-axis direction and the RF pulses are applied as shown in FIG. 1, the nuclear spins of only the frequency portion of the RF pulses on the Z axis are excited. The 90° pulse is first applied and immediately thereafter the readout gradient magnetic field Gx is applied to promote phase diffusion of the excited spins. Next, when the 180° pulse is applied, the nuclear spins are excited by 180°, and the diffusing direction of the nuclear spins reverses. When the readout gradient magnetic field is again applied, the nuclear spins converge and generate sharp echo signals in the time twice the pulse interval between the 90° and 180° pulses. This time is referred to as the "echo time" (Te).

The echo signal hereby obtained represents one dimensional projected image data in the readout direction (X-axis direction in FIG. 1), but a two-dimensional image cannot be reconstructed by this data alone. Therefore, the gradient magnetic field Gy is applied in an encoding direction (Y-axis direction) as still another axis during the application of the readout gradient magnetic field which provides the phase diffusion between the 90° and 180° pulses in order to impart phase rotation to the nuclear spins in accordance with positions in the Y-axis direction. In this way, data in the encoding direction is superposed on the echo signal as phase data. Furthermore, the echo signals are measured repeatedly by applying this encoding gradient magnetic field while changing its intensity. In this case, the time between the 90° pulses is referred to as the "repetition time" (Tr). Positive and negative numbers are imparted to the encoding quantity. When the encoding number is zero, the quantity of the encoding gradient magnetic field is zero, and positive and negative encoding quantities are imparted.

Generally, a number of times of encoding is from 128 to 256 to secure sufficient resolution of the image.

When the echo signal train obtained in this way is analyzed by two-dimensional Fourier transform means, two-dimensional image data can be obtained. An image reconstruction method by this two-dimensional Fourier transform will be hereinafter referred to as the "2DFT".

Next, image weighting which is clinically important for MRI images will be explained. The spins of protons include two kinds of relaxation which change in accordance with their existing environment, that is, a longitudinal relaxation and a transverse relaxation. A signal intensity S can be calculated from the relaxations as represented by the following equation (1):

$$S=\rho(1-\exp(-Tr/T1))\cdot(\exp(-Te/T2)) \quad (1)$$

where $\rho$ is the density of the existing protons, T1 is the time required for the signal density to recover to $1-1/e$ when a saturation level of the signal intensity is "1" in the longitudinal relaxation and is a value inherent to a respective texture, and T2 is the time required for the signal intensity to recover to $1/e$ in the transverse relaxation and is a value inherent to a respective texture.

The second term on the right side of the equation (1) represents a recovery process of the signal intensity with respect to the repetition time Tr, and this is the longitudinal relaxation (which depends on the T1 value). The third term represents a decay process of the signal intensity with respect to the echo measurement time Te, and results from the transverse relaxation (which depends on the T2 value).

FIGS. 3A to 3E are explanatory views useful for explaining the relation between the measured echo signal intensity and Tr as well as Te. It will be hereby assumed that a subject has a texture A on the outer side and a texture B on the inner side. FIG. 3A shows the recovery process of the signal due to longitudinal relaxation, FIG. 3B shows the decay process of the signal due to transverse relaxation, and FIG. 3C show image contrasts when Tr and Te are combined in various ways.

When a T1 weighted image reflecting the T1 value is to be imaged, any influences of exp(−Te/T2) in the equation (1) are minimized by the use of a Te value which is as small as possible (represented by symbol S in FIG. 3A) so as to suppress the influences of the transverse relaxation, and a relatively small value is used for Tr (represented by symbol "S" in FIG. 3A; generally not greater than 500 ms in the human body) so that a T1 difference between the textures A and B can be extracted. In this example, the T1 value of the texture B is smaller than that of the texture A as shown in FIG. 3A. Therefore, signal recovery by the longitudinal relaxation is quicker in the texture B than in the texture A, and a signal having a higher signal intensity can be obtained in the texture B than in the texture A. As a result, a brighter image can be obtained in the texture B than in the texture A as shown in A of FIG. 3C. When a T2 weighted image is to be imaged, a signal of each texture is recovered by the use of a sufficiently long Tr (represented by symbol "L" in FIG. 3A; generally not shorter than 1,500 ms), and imaging is carried out while Te is set to a longer value (represented by symbol "L" in FIG. 3B; generally about 100 ms). In this example, since the T2 value of the texture A is longer as shown in FIG. 3B, an image having a reverse contrast relative to that of the T1 weighted image can be obtained as shown in B of FIG. 3C. When Tr is set to a long value with Te being set to a short value, an image which is not affected by the T1 and T2 values of each texture can be obtained as shown in C of FIG. 3C. This image is one relying on the proton density of the texture, and is referred to as a "proton density image". The T1 and T2 values change, even in the same texture, depending on the state (in the texture e.g. a tumor), and are therefore used to specify a disease portion.

The description given above explains the outline of MRI. For further details, refer to "NMR Medical Science (Basis and Clinical Application)", edited by the NMR Medical Science Society, Research Meeting, published by K. K. Maruzen, Jan. 20, 1984.

To obtain various weighted images useful for clinical study, the combination of Tr and Te optimal for a pulse sequence must be set in accordance with the texture to be imaged. However, to obtain the T2 weighted image, Tr must be set to a long value. Since the imaging time is given by the product of Tr and the number of times of encoding, there remains the problem that imaging cannot be finished within a short time. On the other hand, Te must be shortened to obtain the T1 weighted image. To satisfy this requirement, a reception band of signal measurement must be expanded. Therefore, there remains the problem that a signal-to-noise ratio (S/N) increases.

SUMMARY OF THE INVENTION

The present invention aims at providing an apparatus and method which solves the problems such as the increase of the imaging time and the decrease of the S/N resulting from the imaging sequence, and can provide excellent MRI images.

To enable the principle of the present invention to be more clearly understood, FIG. 4 shows the difference between the MRI images depending on the measurement data range.

In signal measurement by the 2DFT, more detailed data in the encoding direction can be collected by applying more strongly the encoding gradient magnetic field. To simplify the explanation, it will be hereby assumed that signal data measurement is carried out eleven times from encode No. +5 to encode No. −5, and normal images can be obtained if image reconstruction processing is carried out using all the data as shown in A of FIG. 4. Here, if image reconstruction processing is carried out using the five data to be encoded within the range of ±2 at the central portion as shown in B of FIG. 4, only rough data in the encoding direction (corresponding to low frequency components) are utilized. Accordingly, although contrast of brightness of the image can be obtained, detailed data such as profile data cannot be obtained, and the image becomes unclear. In contrast, if image reconstruction processing is carried out by inserting the encode of the central portion as the zero data into the +3 to +5 encodes and −3 to −5 encodes at the peripheral portions (corresponding to the high frequency data) as shown in C of FIG. 4C, an image having an extracted profile data can be obtained. It can thus be understood that the data of the reconstructed image can be separated substantially into the contrast component and the profile component in accordance with The encode range used.

Therefore, it is possible to shorten the imaging time and to obtain an image having a high S/N by measuring the data as quickly as possible by setting Tr to a short time and Te to a value capable of securing sufficient S/N at the time of encoding of the peripheral portions which determine resolution of the image, and measuring the data by setting Tr and Te to shorter values than those used for encoding of the peripheral portions, such as the normal Tr and Te values, at the time of encoding of the central portion which contributes to the contrast of the image. In this case, data of the different sequences are synthesized and reconstructed in the image reconstruction processing. Therefore, correction of the signal levels and discontinuity is carried out.

In the pulse sequence of the present invention described above, the signals are measured by changing Tr and Te during the execution of full encoding, and the image is reconstructed by the data having image data which are different in accordance with this encoding range. As a result, the present invention provides advantages such as the shortening of the imaging time, the improvement in the S/N and in the image weighting state, and arbitrary setting of the imaging time. In this way, the present invention can always provide excellent images.

BRIEF DESCRIPTION OF THE DRAWINGS

FIG. 5 is a block diagram showing the overall structure of an MRI apparatus according to the present invention;

Figure 10:
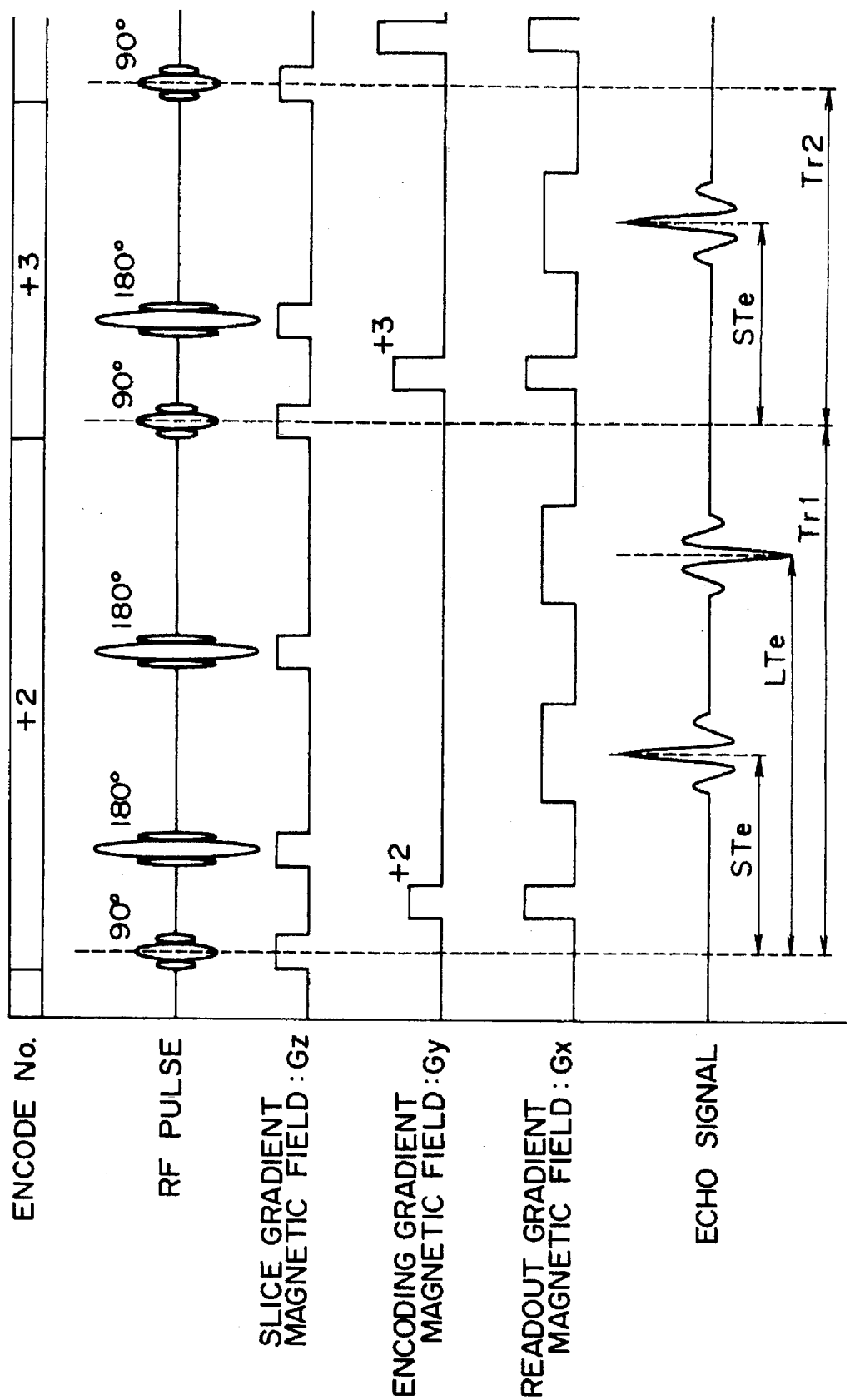
Figure 11:
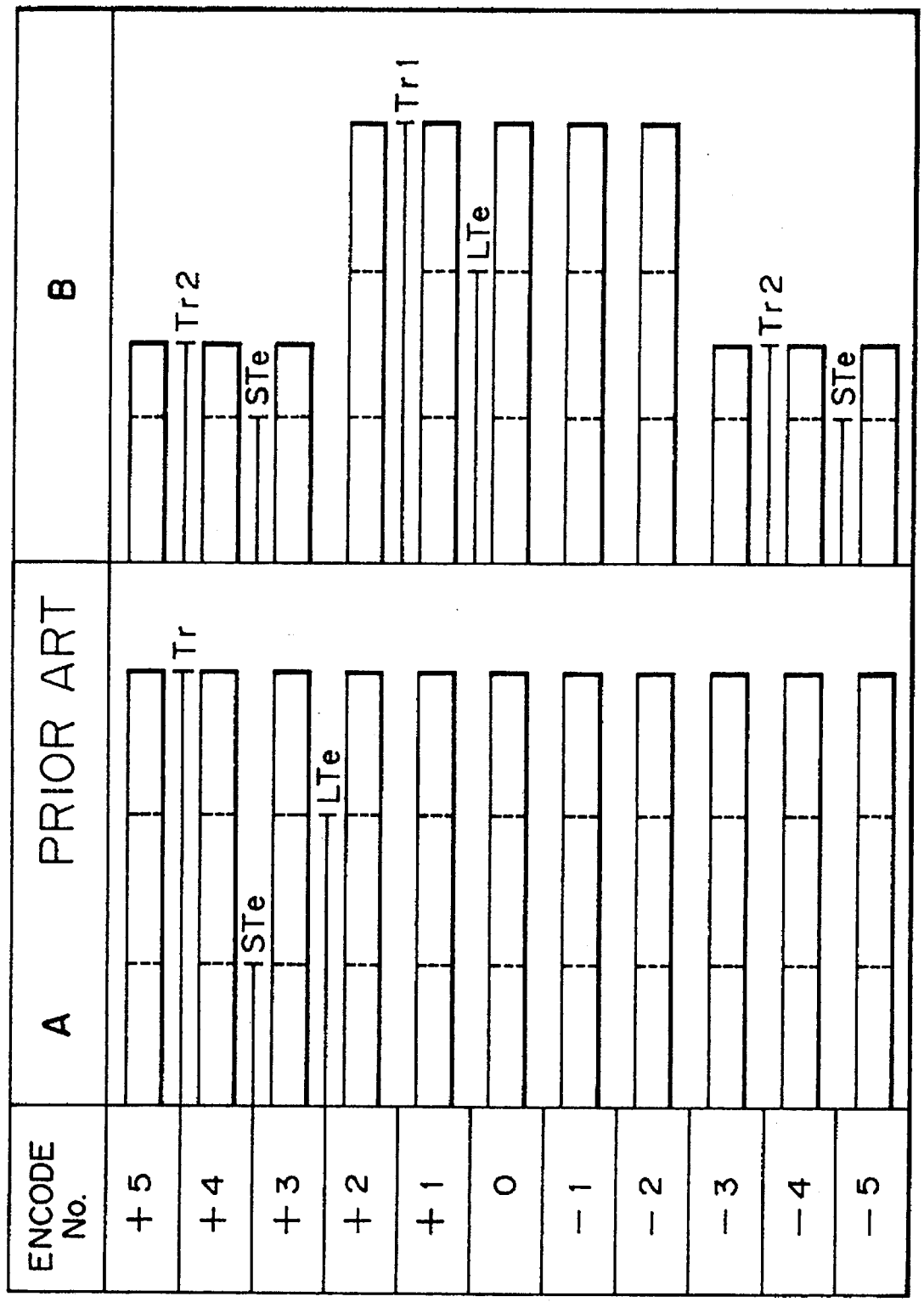
Figure 13B:
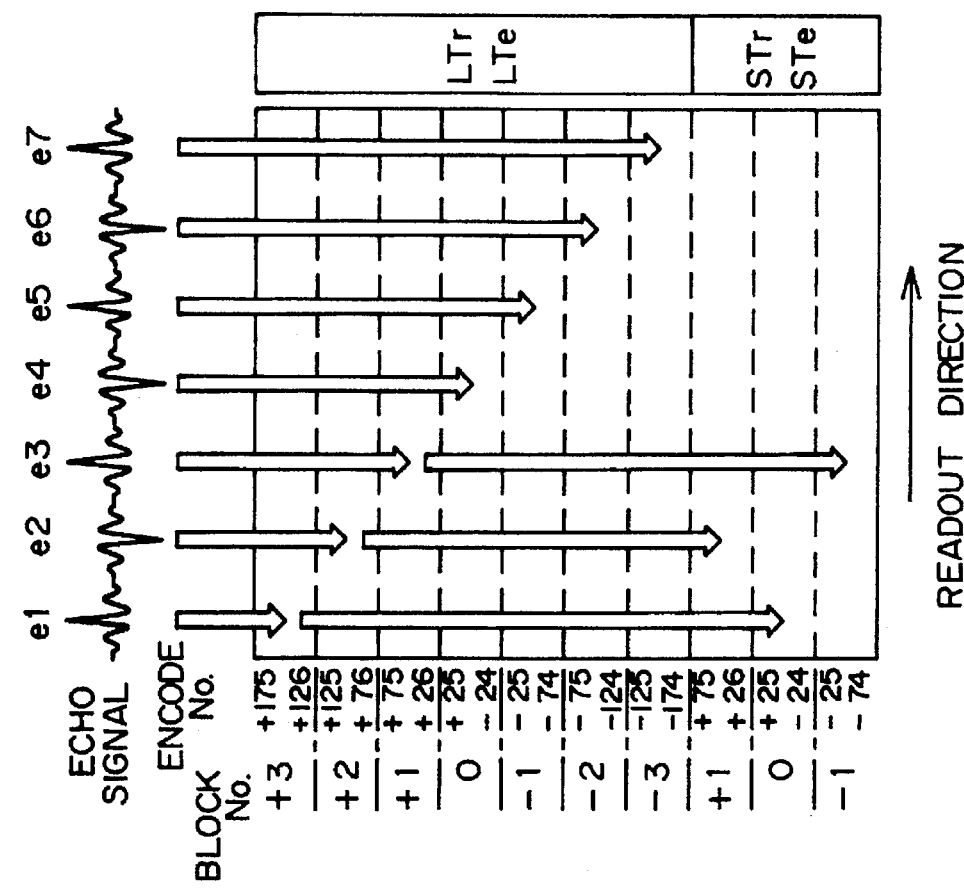
Figure 13A:
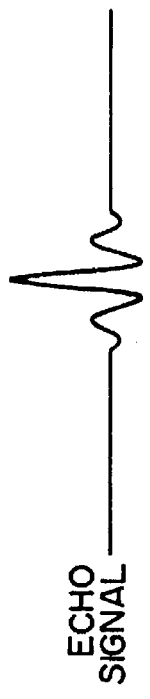

A of FIG. 7 is a diagram useful for explaining the relation between a conventional encode number and a repetition time;

B of FIG. 7 is a diagram useful for explaining the relation between the encode number and the repetition time in the present invention;

FIG. 8 is a timing chart of a pulse sequence according to the present invention;

FIG. 9 includes explanatory views useful for explaining examples of image reconstruction according to the present invention;

FIG. 10 is a pulse sequence diagram when the present invention is applied to a multi-echo method;

A of FIG. 11 is a diagram showing the relation between an encode number and a repetition time in the conventional multi-echo method;

B of FIG. 11 is a diagram showing the relation between the encode number and the repetition time in the multi-echo method to which the present invention is applied;

FIG. 12 is a pulse sequence diagram when the present invention is applied to a multi-encode method;

FIG. 13A is an explanatory view useful for explaining a measuring method when the present invention is applied to a single encode method;

FIG. 13B is an explanatory view useful for explaining the measuring method when the present invention is applied to the multi-encode method;

FIG. 14 is an explanatory view when the time axis of FIG. 13B is used as the reference;

FIG. 15 is a diagram showing another embodiment of the present invention; and

FIGS. 16 is a diagram showing still another embodiment of the present invention.

DESCRIPTION OF THE PREFERRED EMBODIMENTS

Hereinafter, some preferred embodiments of the present invention will be described with reference to the accompanying drawings.

FIG. 5 is a structural view showing an example of the overall construction of an MRI apparatus according to the present invention. This MRI apparatus obtains a tomogram of a subject 6 by utilizing nuclear magnetic resonance (NMR), and comprises a magnet 10 for generating a static magnetic field, a central processing unit (hereinafter referred to as the "CPU") 11 including RAMs, ROMs and a CPU, a sequencer 12, a transmission system 13, a gradient magnetic field generation system 14, a receiving system 15 and a signal processing system 16. The magnet 10 for generating a static magnetic field generates a strong and homogeneous static magnetic field in a space having a certain extent around the subject 6, and includes a resistive magnet system or a superconducting magnet system.

The sequencer 12 operates under the control of the CPU 11, and sends various instructions necessary for collecting data of the tomogram of the subject 6 to the transmission system 13 and to the gradient magnetic field generation system 14.

The transmission system 13 comprises a radio frequency oscillator 17, a modulator 18, a power amplifier 19 and a transmission coil 20 on the transmission side. The RF pulse outputted from the RF oscillator 17 is modulated by the modulator 18 in accordance with the instruction from the sequencer 12, and the modulated RF pulse is amplified by the power amplifier 19 and is supplied to the transmission coil 20 disposed in an proximity of the subject 6 so that the electromagnetic wave can be transmitted to the subject 6.

The gradient magnetic field generation system 14 comprises gradient magnetic field coils 21 wound in three-axes directions of X, Y and Z, and gradient magnetic field power sources 22 for driving these coils. When this system 14 drives the gradient magnetic field power sources 22 of the respective coils in accordance with the instruction from the sequencer 12, gradient magnetic fields Gx, Gy and Gz in the X, Y and Z three-axes directions are applied to the subject 6. A slice plane in the subject 6 can be set in accordance with the method of applying these gradient magnetic fields.

The receiving system 15 comprises a receiving coil 2, a receiving circuit 23, a quadrature phase detector 24 and an A/D converter 25. The electromagnetic wave (NMR signal) of the subject 6 responsive to the electromagnetic wave irradiated by the transmission coil 20 on the transmission side is detected by the receiving coil 2 disposed in the proximity of the subject 6 and is amplified by the receiving circuit 23. The amplified signal is orthogonally detected by the quadrature phase detector 24 based on a reference frequency signal outputted from the RF oscillator 17 and converted to collected data of two systems. Then, these signals are converted to digital signals by the A/D converter 25 at the timing designated by the instruction from the sequencer 12 and are sent to the signal processing system 16. The signal processing system 16 comprises the CPU 11, a recording device such as a magnetic disk 26 and an optical disk 27, and a display 28 such as a CRT (cathode-ray tube). The CPU 11 executes processing such as Fourier transform, correction coefficient computation, image reconstruction, etc., executes suitable computation for a signal intensity distribution on an arbitrary section as the slice plane or for a plurality of signals, converts the resulting distribution to an image and displays the image on the display 28. In this drawing, the transmission coil 20, the receiving coil 2 and the gradient magnetic field coils 21 are disposed inside the magnetic field space of the magnet 10 for generating the static magnetic field, which is disposed in the space around the subject 6.

Next, the pulse sequence in the present invention will be explained in comparison with the conventional pulse sequence.

Figure 6B:
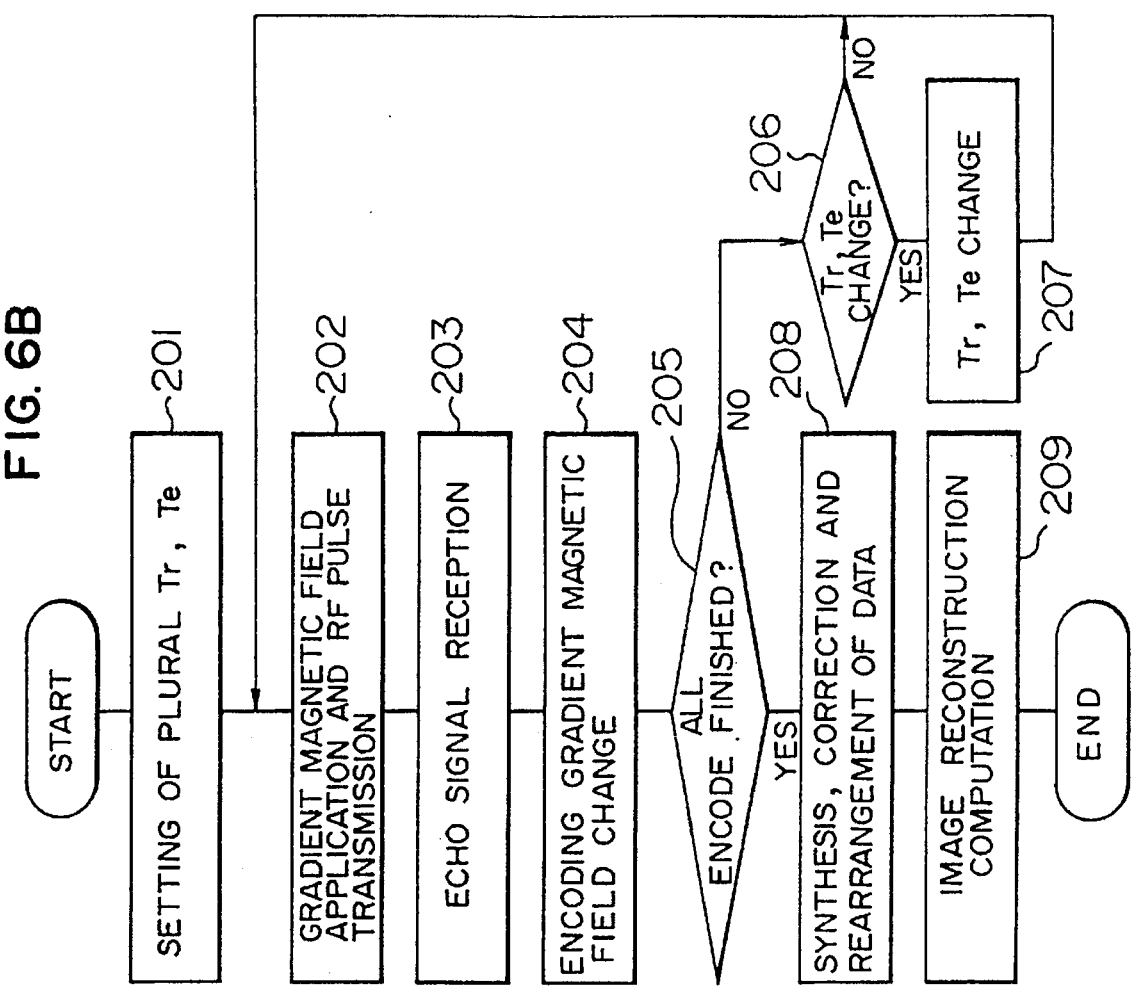
FIG. 6B is a flowchart of a pulse sequence according to the present invention.
Figure 6A:
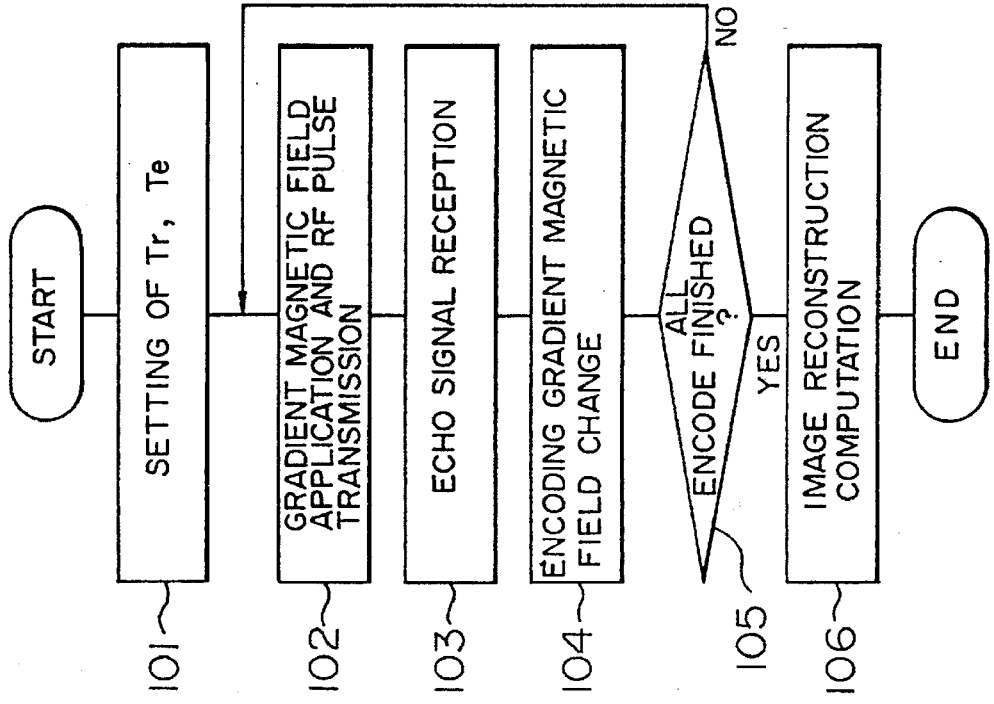
FIG. 6A is a flowchart of a conventional pulse sequence.

As shown in FIG. 6A, the conventional sequence comprises the steps of setting Tr and Te before the execution of the pulse sequence (step 101), applying the gradient magnetic field and transmitting the RF pulses (step 102), receiving the echo signals (step 103), changing the encoding gradient magnetic field (step 104), carrying out the measurement with the same Tr and Te until the full encoding is completed (step 105), and thereafter carrying out image reconstruction computation (106). In the prior art technology, Tr is fixed.

FIG. 6B shows the pulse sequence of the present invention. This pulse sequence is executed as the sequencer 12 applies the application timings and levels of the gradient magnetic field and the RF pulses to the gradient magnetic field power sources 22 of X, Y and Z and to the modulator 18 under the control of the CPU 11.

A plurality of different Tr and Te are set in accordance with the range of the intensity of the encoding gradient magnetic field before the execution of the pulse sequence (step 201). The gradient magnetic field generation system 14 and the transmission system 13 are controlled on the basis of the relation between the intensity of the encoding gradient magnetic field and Tr and Te that are set as described above, and the gradient magnetic fields Gz, Gy, Gx are applied and The RF pulses are transmitted in a predetermined sequence (step 202). The echo signals generated by this sequence are received (step 203), and the intensity of the encoding gradient magnetic field is changed for the measurement of the next echo signal (step 204). Here, whether or not Tr and Te are to be changed is checked (steps 205 and 206), and if the change of Tr and Te is set in advance, the measurement of the echo signal is carried out by changing Tr and Te (steps 207, 202, 203, 204). When the full encoding is completed (step 205), discrepancy of the data levels resulting from the difference of Tr and Te and discontinuity of the data are corrected, and a processing for synthesizing these data and aligning them again in accordance with the encoding sequence is executed (step 208). Thereafter, image reconstruction computation is carried out (step 209).

As to setting of the repetition time, there are two cases, that is, the case where the repetition time is automatically set by predetermined functions when the imaging conditions such as the imaging time and the kind of the weighted image are inputted, and the case where a user sets the repetition time in accordance with the imaging condition.

The relation between the intensity of the encoding gradient magnetic field and Tr, Te that are set is stored in the RAM inside the CPU 11, and is sequentially read out for each pulse sequence and is outputted to the sequencer 12.

In another embodiment, the relation between the intensity of the encoding gradient magnetic field and Tr, Te is comported each time and is outputted to the sequencer 12.

A of FIG. 7 shows the relation between an encode number (No.) and Tr, Te in the conventional sequence, and B of FIG. 7 shows the relation between the encode No. and Tr, Te in the pulse sequence of the present invention.

In B of FIG. 7, Tr is set to a shorter value Tr2 than Tr in the conventional sequence for the range for the encodes Nos. 5 to 3 and −3 to −5, and to a longer value Tr1 than Tr2 from the encodes Nos. 2 to −2, and measurement is carried out under such a condition. When the encode number reaches 2 and −2, Tr and Te are changed to preset values, respectively, and the echo signal is measured.

In A and B of FIG. 7, measurement is carried out by changing the encoding gradient magnetic field over the ±5 stages or in other words, eleven times in total, but in practical imaging, this change is effected about 256 times. Since the total measurement time is the product of this number of times of encoding and the repetition time Tr, it is represented by an area in these drawings. Needless to say, when the S/N is to be improved by computing an addition mean, the area increases as much. When a T2 weighted image is to be imaged, for example, a longer Tr is necessary. Therefore, if Tr is set to 2,000 ms, a measurement time of 2,000×256=8 minutes 32 seconds is necessary.

Figure 1:
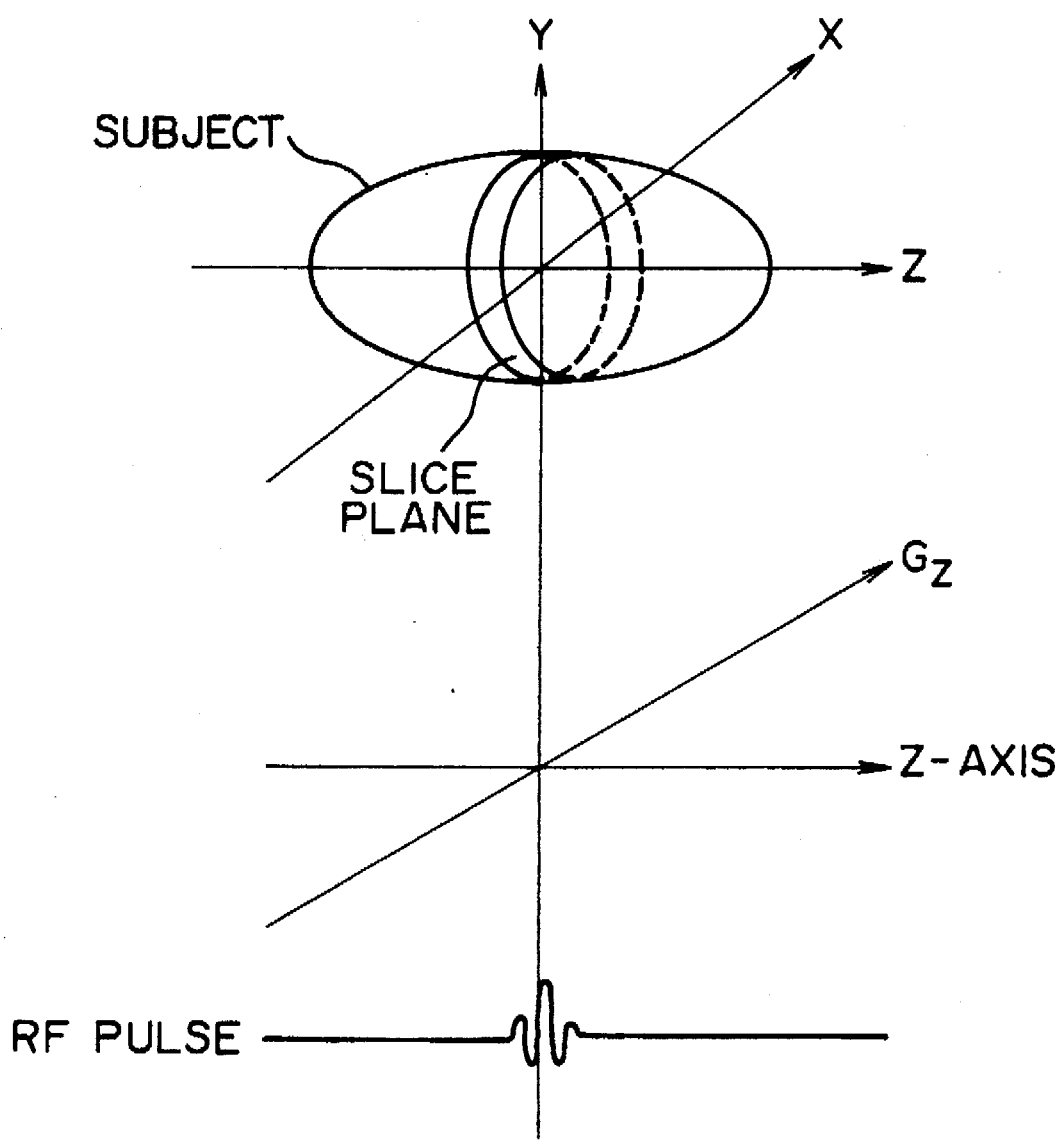
FIG. 1 is a diagram showing the relation between a slice plane and a gradient magnetic field.
Figure 2:
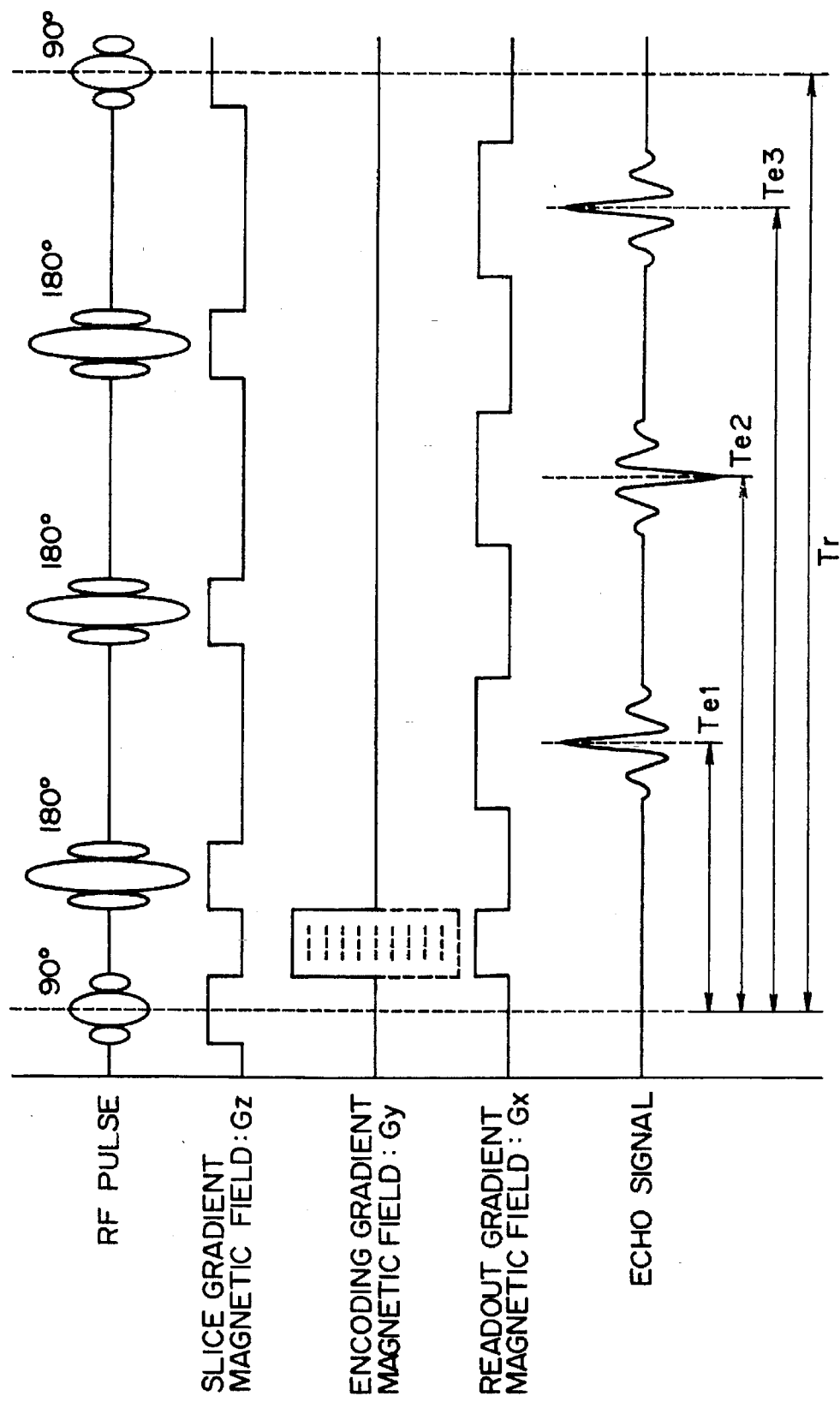
FIG. 2 is a pulse sequence diagram according to a conventional spin echo method.
Figure 3B:
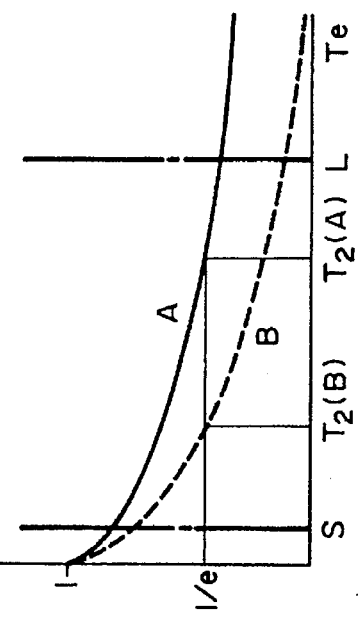
FIGS. 3A to 3C are explanatory views useful for explaining contrast of images depending on a relaxation time.

Therefore, in the present invention, the central encode portion (from +2 to −2) that affects contrast is measured with the same repetition time as that of the conventional method, and the peripheral encode portions that provide profile component data of the image are measured by changing the repetition time to a shorter repetition time so as to shorten the imaging time. In FIG. 7B, the repetition time is set to Tr1 for the range of ±2 encodes and to Tr2 shorter than Tr1 for the other ranges. It can be understood that the total measurement time is reduced by the decrease of the area. Let's examine more practically the example of the T2 weighted image described above. The repetition time is set to Tr=2,000 ms for the 128 encodes at the central portion (encode Nos. +63 to −64) and to a smaller time of 500 ms for the peripheral encode portions. In this way, the total measurement time becomes (2,000×128)+(500×128)=5 min. 20 sec. In other words, the imaging time can be shortened by about 40% at substantially the same level of image quality. At this time, an improvement of the S/N can be expected by changing also Te to a shorter time at the central encode portion and the peripheral portions because, since the signal intensity drops exponentially due to the transverse relaxation as shown in FIG. 3B, the signal intensity becomes higher with a shorter Te time.

FIG. 8 is a timing chart of the pulse sequence according to the present invention, and show the +2 and +3 encode portions. To shorten Tr, t2 of the +3 encode is made smaller than t1 of the +2 encode. Te, too, is shortened by making t4 smaller than t3.

The CPU 11 executes image reconstruction processing using the measurement data of all the encodes thus obtained. At this time, the levels of data resulting from the change of the pulse sequence during the measurement are corrected. Incidentally, the smaller the encode range at the center which uses the normal Tr and Te values, the shorter the imaging time, but a suitable range must be set because image quality changes more greatly than in the conventional method. Besides the T2 weighted image, this imaging method provides the reduction of the imaging time or the improvement of the S/N in other imaging operations such as the T1 weighted image and the proton density image.

B to D of FIG. 9 show a method which conducts the measurement using a pulse sequence capable of measuring the peripheral portions within a short time and increasing the S/N, makes the continuous measurement of the central encode portion by changing Tr and Te and combining the measurement data of the peripheral encode portions with the measurement data of the central encode portion to execute image reconstruction processing, and makes imaging of various weighted images within a short time. From the clinical aspect, T1 weighted, T2 weighted, and and the proton density images must be imaged, and this method is very effective because it can take such images efficiently.

Figure 3A:
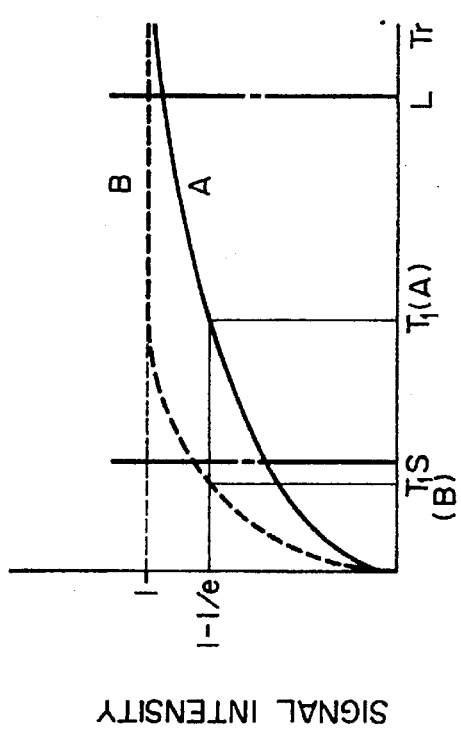
Figure 3C:
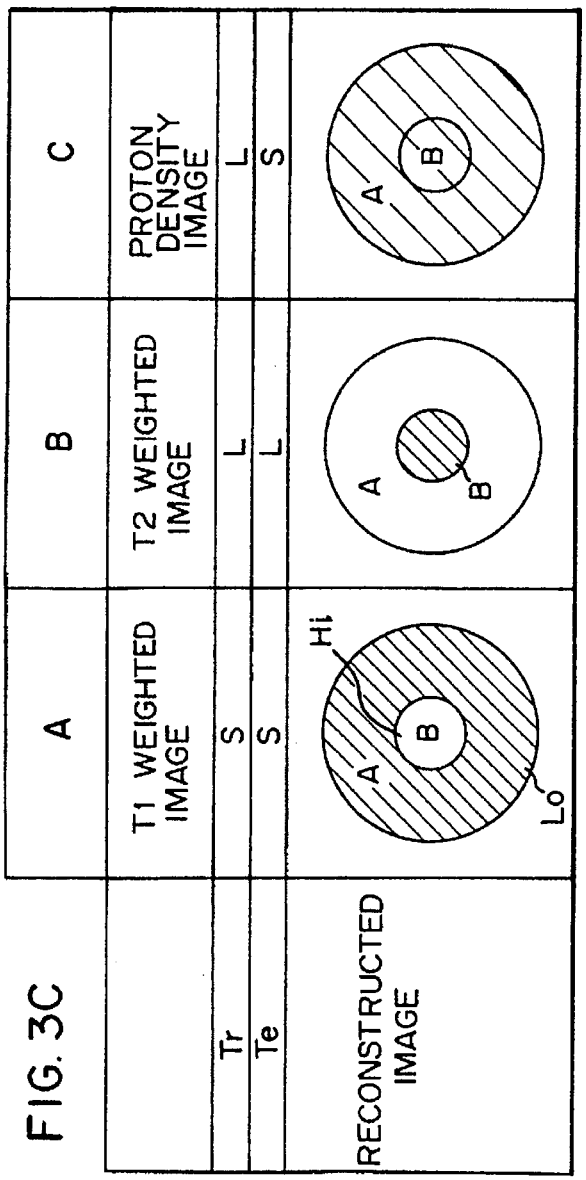
Figure 4:
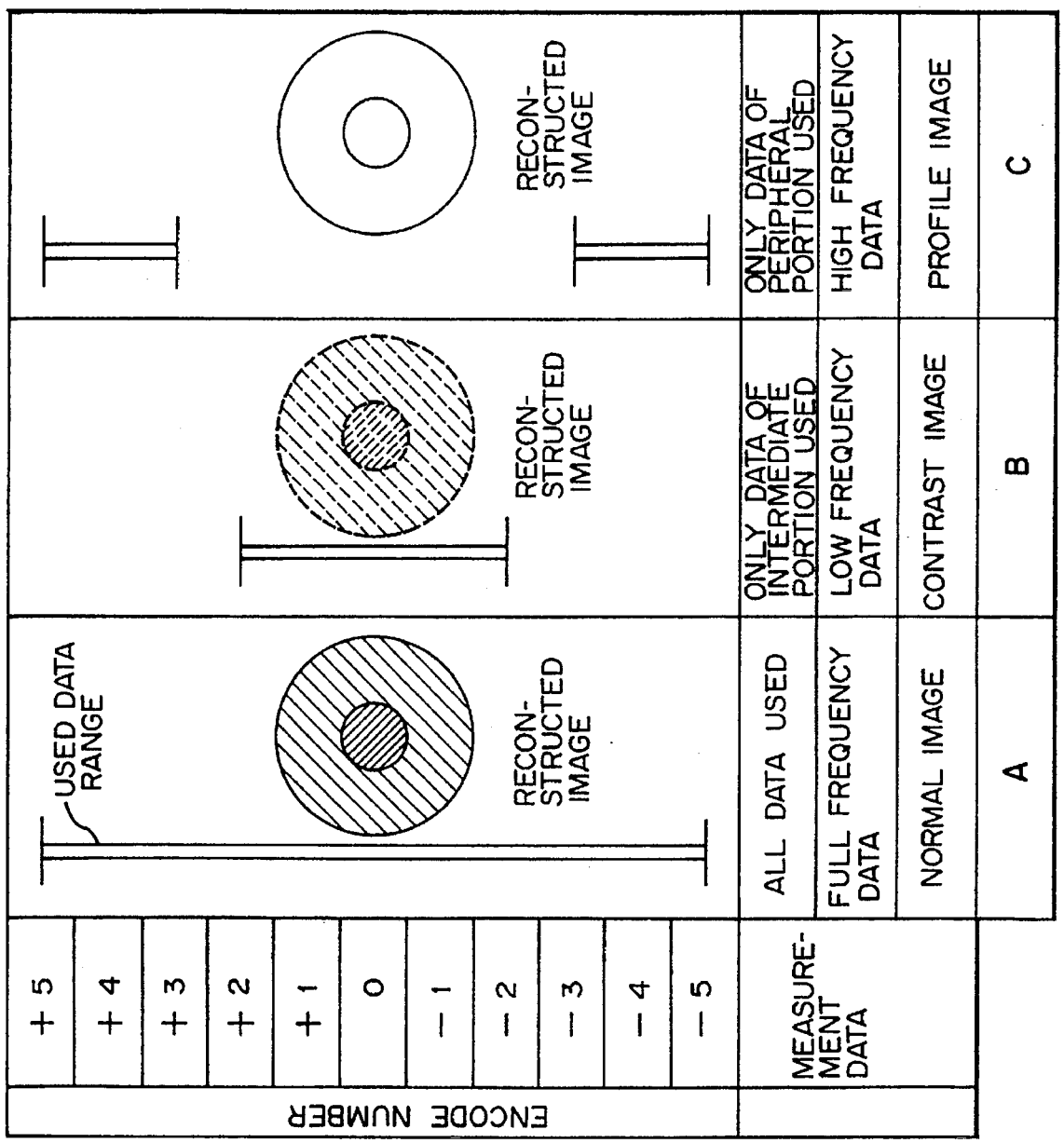
FIG. 4 includes explanatory views useful for explaining the difference between MRI images depending on a measurement data range.

A of FIG. 9 shows partial reconstruction images 51 to 54 obtained by measuring the textures A, B shown in FIGS. 3A to 3C under the conditions shown in A of FIG. 9.

The image 51 represents only the profile, and this profile is distinct.

In the image 52, the profile is not distinct, and the image is darker at the peripheral portion than at the central portion.

In the image 53, the profile is not distinct, and the image is darker at the central portion than at the peripheral portion.

The profile of the image 54 is not distinct, and the image has equal brightness as a whole.

When the image 51 is combined with any one of the images 52, 53 and 54, a desired image such as shown in B to D of FIG. 9 can be obtained.

Imaging can be carried out more efficiently in accordance with the well know multi-echo method by utilizing the feature of the present invention wherein the data of the central portion of the T2 weighted image and that of the proton density image is obtained with a long Tr. FIG. 10 shows a timing chart when the multi-echo sequence is applied to the present invention. After the first echo signal is collected in this way in the multi-echo sequence, a series of sequences downstream of the 180° pulses are repeated and the spin is again converged so as to measure several echo signals within one Tr interval. Though FIG. 10 shows the example of two echos, the multi-echo method provides the advantage that signals having two different values of Te (that is, STe and LTe) can be obtained within one Tr interval.

According to the conventional multi-echo method, both of the images of short Te (STe) and long Te (LTe) are obtained by one sequence as shown in A of FIG. 11. Therefore, when this multi-echo method is applied to the present invention as shown in B of FIG. 11, the images of various weighted states can be obtained within a shorter time by setting the peripheral encode portions, which do not contribute to the contrast of the image, to a shorter repetition time Tr2 to receive the signals by of the single echo of STe, and simultaneously obtaining STe and LTe by setting the central encode portions to the longer repetition time Tr1. Needless to say, this multi-echo method can be accomplished by a short Tr of the peripheral portions, too.

The operation speed can be further improved by applying the sequence of the multi-encode method (which is also referred to as a "high speed SE method") to the present invention. FIG. 12 shows a timing chart when the multi-encode method is applied to the present invention. The multi-encode method is one that obtains simultaneously the echo signals having different encode quantities by applying the encoding gradient magnetic field in the pulse form for each echo signal. In FIG. 12, the portion of Tr2 corresponds to the multi-encode method, and measurement of +3 and +2 encodes are made by the use of two echos. Since the measurement can be carried out by applying two kinds of encoding gradient magnetic fields in the time Tr2 as shown in the timing chart, the imaging time can be reduced to the extent corresponding to the number of echos.

An embodiment of the present invention using the multi-encode method will be explained with reference to FIGS. 13A and 13B. To simultaneously obtain the clinically effective T1 and T2 weighted images as shown in B and C of FIG. 9, the combination of LTr, LTe and STr, STe must be obtained in the central encode portion that determines the contrast.

In an embodiment of the present invention, signal reception is made by changing Tr and Te at only the central encode portion as shown in FIG. 13A and partial data are collected so as to avoid overlap of the peripheral portions. In the drawing, the number of encodes at LTr and LTe is 350 (times) from +175 to −174 while the number of encodes at STr and STe is 150 (times) from +75 to −74 at the central portion. Accordingly, signal reception at STr and STe that is effected after the measurement in LTr and LTe is made 150 times, and the total number of times of measurement is 500 times. Assuming that LTr=2,000 ms and STr=500 ms, the imaging time is (2×350)+(0.5×150)=12 min. 55 sec.

In FIG. 13B showing the application example of the multi-encode method, the full encodes of 350 times at LTr are divided by 50 times into seven blocks ranging from block number +3 to block number −3 as shown in the drawing such as block number +3 that covers the encodes Nos. +175 to +126 and block number +2 that covers the encodes Nos. +125 to +76. Seven echo signals of e1 to e7 are generated whenever one signal is received by the aforementioned multi-echo method, each signal is encoded, and imaging is carried out in such a manner as to distribute the reception data to each block as represented in arrows in the drawing. In other words, seven encode signals of +175, +125, +75, +25, −25, −75 and −125 are simultaneously received in one Tr by the first signal reception, and seven encode signals of encodes +174, +124, +74, +24, −26, −76 and −126 are likewise received in the second signal reception. When the pulse sequence is executed by shifting sequentially the encode numbers in this way, seven blocks can be finished by measurement of 50 times. At this time, the block No. 0 containing the zero encode determines the weighting state of the image. Therefore, the effective Te must be set to a long LTe by allocating the central blocks Nos. +1 to −1 to the echo signals e3 to e5.

Next, data reception of the blocks +1 to −1 at the central portion is carried out by changing Tr to STr. At this time, since the number of blocks is 3, the number of echos is 3, and the echo signals are distributed so that the echo signal e1 exists in the block No. 0 in order to provide STe. Since this portion, too, can be finished by the measurement of 50 times, the total number of times of measurement is 100. The measurement time is (2×50)+(0.5×50)=2 min. 5 sec. such the measurement time is be reduced drastically.

FIG. 14 shows this example of a sequence in terms of a time axis. Among the signal reception of 100 times, the former half (1 to 50) corresponds to LTr and the latter half (51 to 100), corresponds to STr. The signals having the respective echo numbers shown in the diagram are distributed to each block so as to position the effective Te at the positions of the circles.

In this embodiment, the portion of LTr and the portion of STr are divided, and the measurement is carried out at STr after the measurement at LTr, but in this case, the image might be deteriorated if any motion occurs in the subject because, when the T1, T2 weighted images are reconstructed by exchanging the central portion, the blocks +3 and +2 that are received previously are combined with the blocks +1 to −1 that are received later.

This problem can be solved by an alternate reception method which first receives the LTr portion and then the STr portion as shown in FIG. 15. In this case, too, the measurement time remains the same. However, since Tr contributes to the recovery time T1, caution must be paid to the fact that the reception signal is affected by the previous Tr. In other words, the effective Te must be moved effectively by changing the correspondence relation between the block number and the echo number as shown in FIG. 15.

The description given above deals with the pulse sequence which switches and uses short and long Trs. A and B of FIG. 16 show another embodiment which executes imaging by continuously changing Tr and Te for each encode. The imaging time can be shortened by controlling Tr so that it becomes small at the peripheral encode portions as shown in A of FIG. 16. In this case, control can be performed so as to adjust the weighting state and to finish the measurement within an arbitrary set time by setting the change ratio of Tr either manually or by a predetermined function. If control is performed so that Tr and Te are elongated at the central encode portion during imaging of the T2 weighted image and the resulting increase of the measurement time is reduced at the peripheral encode portions, an image having higher contrast can be obtained without changing the imaging time from that of the prior art method.

In this case, too, the relation between the encode number and Tr, Te is set either manually or by a predetermined function.

When this relation is automatically set by a predetermined function, a suitable imaging condition such as the overall imaging time or terms characterizing the weighted image must be inputted.

We claim:

1. A magnetic resonance imaging method comprising the steps of:

setting a repetition time in accordance with an intensity of an encoding gradient magnetic field;

applying a gradient magnetic field for a slice, the encoding gradient magnetic field, a readout gradient magnetic field, and RF pulses to a subject in a predetermined sequence within the set repetition time;

dividing a full range of the intensity of the encoding gradient magnetic field into at least two ranges;

measuring nuclear magnetic resonance (NMR) signals in a first range containing a zero encoding quantity and sandwiched between two predetermined intensities of the encoding gradient magnetic field with a first repetition time by executing a pulse sequence for generating a plurality of NMR signals within one repetition time;

measuring NMR signals in second, third, . . . nth ranges (where n is an integer) not contained in the first range with second, third, . . . nth repetition times, respectively; and reconstructing an image by combining the NMR signals measured in the first range with the NMR signals measured in the ranges other than the first range.

2. A magnetic resonance imaging method comprising the steps of:

setting a repetition time in accordance with an intensity of an encoding gradient magnetic field;

applying a gradient magnetic field for a slice, the encoding gradient magnetic field, a readout gradient magnetic field, and RF pulses to a subject in a predetermined sequence within the set repetition time;

measuring nuclear magnetic resonance (NMR) signals in a full encode range With a first repetition time, the full encode range including (1) a first range containing a zero encoding quantity and sandwiched between two predetermined intensities of the encoding gradient magnetic field and (2) a portion other than the first range such that the NMR signals measured in the full encode range with the first repetition time include NMR signals measured in the portion of the full encode range other than the first range with the first repetition time;

measuring NMR signals in the first range with a repetition time which is different from the first repetition time;

reconstructing a first image having a first contrast from the NMR signals measured in the full encode range with the first repetition time; and reconstructing a second image having a second contrast different from the first contrast by combining the NMR signals measured in the first range with the repetition the which is different from the first repetition time with the NMR signals measured in the portion of the full encode range other than the first range with the first repetition time.

3. A magnetic resonance imaging method comprising the steps of:

setting a repetition time in accordance with an intensity of an encoding gradient magnetic field;

applying a gradient magnetic field for a slice, the encoding gradient magnetic field, a readout gradient magnetic field, and RF pulses to a subject in a predetermined sequence within the set repetition time;

measuring nuclear magnetic resonance (NMR) signals in a full encode range with a first repetition time, the NMR signals measured in the full encode range including at least one NMR signal for each encoding quantity of the full encode range, the full encode range including (1) a first range containing a zero encoding quantity and sandwiched between two predetermined intensities of the encoding gradient magnetic field and (2) a portion other than the first range such that the NMR signals measured in the full encode range with the first repetition time include NMR signals measured in the portion of the full encode range other than the first range with the first repetition time;

measuring NMR signals in the first range with repetition time which is different from the first repetition time, the NMR signals measured in the first range including at least one NMR signal for each encoding quantity of the first range;

reconstructing a first image having a first contrast from the NMR signals measured in the full encode range with the first repetition time; and reconstructing a second image having a second contrast different from the first contrast by combining the NMR signals measured in the first range with the repetition time which is different from the first repetition time with the NMR signals measured in the portion of the full encode range other than the first range with the first repetition time.

4. A magnetic resonance imaging method according to claim 3, wherein the NMR signals measured in the full encode range with the first repetition time include a single NMR signal for each encoding quantity of the full encode range; and wherein the NMR signals measured in the first range with the repetition time different from the first repetition time include a single NMR signal for each encoding quantity of the first range.

5. A magnetic resonance imaging method according to claim 3, wherein the NMR signals measured in the full encode range with the first repetition time include a plurality of NMR signals for each encoding quantity of the full encode range; and wherein the NMR signals measured in the first range with the repetition time different from the first repetition time include a plurality of NMR signals for each encoding quantity of the first range.

6. A magnetic resonance imaging method comprising the steps of:

setting a repetition time in accordance with an intensity of an encoding gradient magnetic field;

applying a gradient magnetic field for a slice, the encoding gradient magnetic field, a readout gradient magnetic field, and RF pulses to a subject in a predetermined sequence within the set repetition time;

dividing a full range of the intensity of the encoding gradient magnetic field into at least two ranges including (1) a first range containing a zero encoding quantity and sandwiched between two predetermined intensities of the encoding gradient magnetic field and (2) at least one range other than the first range;

measuring nuclear magnetic resonance (NMR) signals in the full range with a first repetition time such that the NMR signals measured in the full range with the first repetition time include NMR signals measured in the at least one range other than the first range with the first repetition time;

measuring NMR signals in the first range with a second repetition time which is different from the first repetition time; and reconstructing an image by combining the NMR signals measured in the first range with the second repetition time with the NMR signals measured in the at least one range other than the first range with the first repetition time;

wherein the step of measuring NMR signals in the full range with the first repetition time and the step of measuring NMR signals in the first range with the second repetition time are alternately carried out.

* * * * *